US009184738B2

(12) United States Patent
Matoba

(10) Patent No.: US 9,184,738 B2
(45) Date of Patent: Nov. 10, 2015

(54) PWM (PULSE WIDTH MODULATION) SIGNAL OUTPUTTING CIRCUIT AND METHOD OF CONTROLLING OUTPUT OF PMW SIGNAL

(75) Inventor: Kenjiro Matoba, Miyazaki (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 154 days.

(21) Appl. No.: 13/606,859

(22) Filed: Sep. 7, 2012

(65) Prior Publication Data

US 2013/0069734 A1   Mar. 21, 2013

(30) Foreign Application Priority Data

Sep. 16, 2011   (JP) .................................. 2011-203398

(51) Int. Cl.
   *H03K 7/08*   (2006.01)
(52) U.S. Cl.
   CPC .......... *H03K 7/08* (2013.01); *H03C 2200/0045* (2013.01)
(58) Field of Classification Search
   CPC ... H03C 2200/0045; H03K 5/04; H03K 5/05; H03K 7/08; H03K 3/017
   USPC ............ 327/172–177; 332/109–111; 375/238
   See application file for complete search history.

(56) References Cited

U.S. PATENT DOCUMENTS

| 5,880,644 | A * | 3/1999 | Schmidt et al. | 332/109 |
| 7,003,031 | B1 * | 2/2006 | Sugita | 375/238 |
| 7,079,758 | B2 * | 7/2006 | Sunaga et al. | 388/804 |
| 7,313,005 | B2 * | 12/2007 | Azuma et al. | 363/41 |
| 7,362,152 | B2 * | 4/2008 | Figoli | 327/172 |
| 7,376,182 | B2 * | 5/2008 | Kris | 375/238 |
| 7,683,597 | B2 * | 3/2010 | Shimada et al. | 323/283 |
| 7,791,386 | B2 * | 9/2010 | Kris | 327/160 |
| 8,279,917 | B2 * | 10/2012 | Takahashi | 375/238 |
| 8,472,213 | B2 * | 6/2013 | Kris | 363/21.1 |
| 2002/0181577 | A1 * | 12/2002 | Bowling | 375/238 |
| 2005/0242858 | A1 * | 11/2005 | Figoli et al. | 327/175 |
| 2006/0064609 | A1 * | 3/2006 | Bryan | 714/700 |

FOREIGN PATENT DOCUMENTS

| JP | 2004-187492 A | 7/2004 |
| JP | 2004-357450 A | 12/2004 |
| JP | 2007-202329 A | 8/2007 |

* cited by examiner

*Primary Examiner* — Levi Gannon
(74) *Attorney, Agent, or Firm* — Kubotera & Associates, LLC

(57) ABSTRACT

A PWM (Pulse Width Modulation) signal outputting circuit includes a counting unit for counting a number of clocks to output a counter value, and for resetting the counter value to resume counting when a reset signal is input to the counting unit; a dead time value storage unit for storing a dead time value; and a plurality of PWM signal outputting units for setting a start setting value and a termination setting value. The PWM signal outputting unit generates a termination signal and a start signal. Further, the PWM signal outputting unit is configured to output a PWM signal, which is raised according to the start signal generated by itself and is decreased according to the termination signal generated by itself. Further, the PWM signal outputting units is configured to generate the termination signal when the counter value matches to the termination setting value generated by itself.

6 Claims, 8 Drawing Sheets

PWM (PULSE WIDTH MODULATION) SIGNAL OUTPUTTING CIRCUIT AND METHOD OF CONTROLLING OUTPUT OF PMW SIGNAL

BACKGROUND OF THE INVENTION AND RELATED ART STATEMENT

The present invention relates to a PWM (Pulse Width Modulation) signal outputting circuit and a method of controlling an output of a PMW signal. More specifically, the present invention relates to a PWM signal outputting circuit and a method of controlling an output of a PMW signal capable of efficiently adding a dead time (a period of time during which each PMW signal is not turned on simultaneously) to each PWM signal having a cyclic period and a duty arbitrarily defined thereto.

In general, a PWM (Pulse Width Modulation) signal has been used for controlling an IGBT (Insulated Gate Bipolar Transistor) and the like disposed for controlling an inverter circuit of an IH (Induction Heating) cooking device and a non-power outage power source device.

For example, an inverter circuit disposed in the IT cooking device is formed of two switching elements, so that the two switching elements are controlled to turn on and off through the PWM signal. In the inverter circuit with such a configuration, when the two switching elements are turned on simultaneously, a through current may flows, thereby causing damage in an inverter control circuit.

In order to prevent the inverter control circuit from being damaged, Patent References 1 to 3 have disclosed technologies, in which an inverter control micro-computer is configured to output a PWM signal with a dead time.

Patent Reference 1: Japanese Patent Publication No. 2004-187492

Patent Reference 2: Japanese Patent Publication No. 2004-357450

Patent Reference 3: Japanese Patent Publication No. 2007-202329

For example, according to Patent Reference 1, a semiconductor device is configured to generate a mutually compensated PWM signal for controlling an inverter circuit. The semiconductor device has a configuration that is configured to make it possible to easily and flexibly add a period of time during which each PMW signal is not turned on simultaneously (the dead time) relative to each of the two PWM signals.

More specifically, the semiconductor device disclosed in Patent Reference 1 includes a first mutually compensated PWM signal generation unit for generating a first PWM signal and a second PWM signal as an inverted signal of the first PWM signal, and a dead time adding unit for adding a first dead time when the first PWM signal is raised and a second dead time when the second PWM signal is raised. Further, the dead time adding unit is configured to be capable of setting the first dead time and the second dead time individually.

Further, in the semiconductor device disclosed in Patent Reference 1, the dead time adding unit includes a dead timer, a first dead time setting register, and a second dead time setting register. Accordingly, the dead time adding unit is configured to be capable of adding a period of time that a value of the dead timer reaches a setting value of the first dead time setting register as the first dead time when the first PMW signal is raised. Further, the dead time adding unit is configured to be capable of adding a period of time that the value of the dead timer reaches a setting value of the second dead time setting register as the second dead time when the second PMW signal is raised.

With the configuration of the dead time adding unit described above, it is possible to set the different dead times relative to the PWM signal and the inverted signal thereof. Accordingly, it is not necessary to change and set the optimal value of the dead time in the semiconductor device. At the same time, it is possible to individually set the optimal dead time, thereby making it possible to accurately control the inverter circuit without increasing power consumption.

In the semiconductor device disclosed in Patent Reference 1, however, it is difficult to solve the following problems.

For example, the semiconductor device includes an IC (Integrated Circuit) for outputting the PWM signal. However, the IC is not necessarily configured to output the mutually compensated signals (the signals with the inverted phases). The IC is desired to have a configuration capable of controlling two phases regardless of outputting the mutually compensated signals or totally different signals. To this end, it is necessary to configure the IC to be able to arbitrarily control a cyclic period and a duty.

A conventional PWM signal outputting circuit will be explained next with reference to FIGS. 1 and 2. The conventional PWM signal outputting circuit has a configuration capable of arbitrarily controlling the cyclic period and the duty relative to each of a plurality of PWM signals.

FIG. 1 is a block diagram showing the configuration of the conventional PWM signal outputting circuit capable of arbitrarily controlling the cyclic period and the duty. FIG. 2 is a timing chart showing an example of an operation of the conventional PWM signal outputting circuit.

As shown in FIG. 1, the conventional PWM signal outputting circuit is formed of, for example, a semiconductor device such as a micro-computer and the like. The conventional PWM signal outputting circuit includes a counter 11; a channel 1 cyclic period setting register 12; a channel 1 duty setting register 13; a channel 2 cyclic period setting register 14; a channel 2 duty setting register 15; a first comparing unit 16a; a second comparing unit 16b; a third comparing unit 16c; a fourth comparing unit 16d; a channel 1 output control circuit 17; and a channel 2 output control circuit 18.

In the conventional PWM signal outputting circuit, the counter 11 is configured to operate synchronizing with a clock output from, for example, a timer and the like disposed in the micro-computer, so that the counter 11 counts the number of the clocks and outputs the number as a counter value.

In the conventional PWM signal outputting circuit, the channel 1 cyclic period setting register 12, the channel 1 duty setting register 13, the first comparing unit 16a, the second comparing unit 16b and the channel 1 output control circuit 17 constitute a first PWM signal generating unit for outputting a first PWM signal (PWM1). Similarly, the channel 2 cyclic period setting register 14, the channel 2 duty setting register 15, the third comparing unit 16c, the fourth comparing unit 16d and the channel 2 output control circuit 18 constitute a second PWM signal generating unit for outputting a second PWM signal (PWM2).

In the conventional PWM signal outputting circuit having the configurations described above, the first PWM signal generating unit and the second PWM signal generating unit are configured to generate and output the PWM signal with the duty value corresponding to the values set in the channel 1 cyclic period setting register 12, the channel 1 duty setting register 13, the channel 2 cyclic period setting register 14, and the channel 2 duty setting register 15, respectively, according to the counter value output from the counter 11.

In the conventional PWM signal outputting circuit, the first comparing unit 16a has a function as a reset circuit for resetting the counting operation of the counter 11 when the counter value output from the counter 11 reaches a specific value defined in advance.

In the conventional PWM signal outputting circuit, the first PWM signal generating unit and the second PWM signal generating unit are configured to store the values set in the channel 1 duty setting register 13 and the channel 2 duty setting register 15 as a start setting value, respectively. Further, the second comparing unit 16b and the fourth comparing unit 16d are configured to compare the counter value output from the counter 11 with the start setting values stored in the channel 1 duty setting register 13 and the channel 2 duty setting register 15, respectively. Further, the first PWM signal generating unit and the second PWM signal generating unit are configured to generate and output a start signal when the counter value matches to the start setting values.

Accordingly, when the second comparing unit 16b and the fourth comparing unit 16d output the start signals, the channel 1 output control circuit 17 and the channel 2 output control circuit 18 of the first PWM signal generating unit and the second PWM signal generating unit generate and output the first PWM signal (PWM1) and the second PWM signal (PWM2), respectively.

In the conventional PWM signal outputting circuit, the first PWM signal generating unit and the second PWM signal generating unit are configured to store the values set in the channel 1 cyclic period setting register 12 and the channel 2 cyclic period setting register 14 as a termination setting value, respectively. Further, the first comparing unit 16a and the third comparing unit 16c are configured to compare the counter value output from the counter 11 with the termination setting values stored in the channel 1 cyclic period setting register 12 and the channel 2 cyclic period setting register 14, respectively. Further, the first PWM signal generating unit and the second PWM signal generating unit are configured to generate and output a termination signal when the counter value matches to the termination setting values.

Accordingly, when the first comparing unit 16a and the third comparing unit 16c output the termination signals, the channel 1 output control circuit 17 and the channel 2 output control circuit 18 of the first PWM signal generating unit and the second PWM signal generating unit stop generating and outputting the first PWM signal (PWM1) and the second PWM signal (PWM2), respectively.

The operation of the first PWM signal generating unit and the second PWM signal generating unit will be explained next with reference to FIG. 2.

In the operation shown in FIG. 2, the termination setting value "7" is set in the channel 1 cyclic period setting register 12; the start setting value "2" is set in the channel 1 duty setting register 13; the termination setting value "4" is set in the channel 2 cyclic period setting register 14; and the start setting value "1" is set in the channel 2 duty setting register 15, respectively. With the setting values set as described above, the counter 11 operates synchronizing with the clock. When the counter value of the counter 11 matches to the start setting value "2" set in the channel 1 duty setting register 13, the second comparing unit 16b generates and outputs the start signal to the channel 1 output control circuit 17.

Accordingly, the PWM1 output from the channel 1 output control circuit 17 is changed from "L" (low) to "H" (high). Afterward, when the counter value of the counter 11 matches to the termination setting value "7" set in the channel 1 cyclic period setting register 12, the first comparing unit 16a generates and outputs the termination signal to the channel 1 output control circuit 17. Accordingly, the PWM1 output from the channel 1 output control circuit 17 is changed from "H" (high) to "L" (low). Further, the value of the counter 11 is cleared.

Further, when the counter value of the counter 11 matches to the start setting value "1" set in the channel 2 duty setting register 15, the fourth comparing unit 16d generates and outputs the start signal to the channel 2 output control circuit 18. Accordingly, the PWM2 output from the channel 2 output control circuit 18 is changed from "L" (low) to "H" (high). Afterward, when the counter value of the counter 11 matches to the termination setting value "4" set in the channel 2 cyclic period setting register 14, the third comparing unit 16c generates and outputs the termination signal to the channel 2 output control circuit 18. Accordingly, the PWM2 output from the channel 2 output control circuit 18 is changed from "H" (high) to "L" (low). Further, the PWM2 output is maintained at "H" (high) until the counter value of the counter 11 matches to the termination setting value "7" set in the channel 1 cyclic period setting register 12, that is, the value of the counter 11 is cleared.

Through the process described above, in the conventional PWM signal outputting circuit having the configuration shown in FIG. 1, it is possible to arbitrarily set the cyclic period and the duty with respect to the two channels.

As described above, in the first PWM signal generating unit and the second PWM signal generating unit, it is possible to arbitrarily set the start setting values and the termination setting values. As shown in FIG. 2, however, when the start setting values and the termination setting values are set, there is a period of time when both the first PWM signal PWM1 and the second PWM signal PWM2 output from the first PWM signal generating unit and the second PWM signal generating unit become "H".

In the conventional PWM signal outputting circuit, when both the first PWM signal PWM1 and the second PWM signal PWM2 become "H", and the first PWM signal generating unit and the second PWM signal generating unit are turned on (ON) during the period of time when both the first PWM signal PWM1 and the second PWM signal PWM2 become "H", there is a period of time when the two channels are simultaneously turned on. For example, when both the first PWM signal PWM1 and the second PWM signal PWM2 are used for controlling the IGBT and the like, a component of the IGBT may be damaged.

As described above, in the conventional PWM signal outputting circuit having the configuration shown in FIG. 1, it is possible to arbitrarily set the cyclic period and the duty with respect to the two channels. However, when the conventional PWM signal outputting circuit is used for controlling the IGBT and the like, the two channels are simultaneously turned on accidentally due to wrong setting.

In view of the problems described above, an object of the present invention is to provide a PWM signal outputting circuit and a method of controlling a PWM signal output capable of solving the problems of the conventional PWM signal outputting circuit. In the present invention, it is possible to set a plurality of PWM signals with a higher degree of flexibility. Further, it is possible to perform a proper operation even when each of the PWM signals is used in a mutually compensating manner.

Further objects and advantages of the present invention will be apparent from the following description of the present invention.

SUMMARY OF THE PRESENT INVENTION

In order to attain the objects described above, according to a first aspect of the present invention, a PWM (Pulse Width Modulation) signal outputting circuit includes a counting unit for counting a number of clocks to output a counter value, and for resetting the counter value to resume counting when a reset signal is input to the counting unit; a dead time value storage unit for storing a dead time value; and a plurality of PWM signal outputting units for setting a start setting value and a termination setting value. Each of the PWM signal outputting units is configured to generate a termination signal and a start signal. Further, each of the PWM signal outputting units is configured to output a PWM signal, which is raised according to the start signal generated by itself and is decreased according to the termination signal generated by itself.

According to the first aspect of the present invention, each of the PWM signal outputting units is configured to generate the termination signal when the counter value matches to the termination setting value generated by itself.

According to the first aspect of the present invention, one of the PWM signal outputting units is referred to as a front stage PWM signal outputting unit when the one of the PWM signal outputting units generates the PWM signal that is raised first. Further, another one of the PWM signal outputting units is referred to as a later stage PWM signal outputting unit when the another one of the PWM signal outputting units generates the PWM signal that is raised next after the PWM signal that is raised first.

According to the first aspect of the present invention, when a difference between the start setting value generated by itself and the termination setting value generated by the front stage PWM signal outputting unit is smaller than the dead time value, the later stage PWM signal outputting unit is configured to generate the start signal when a sum of the termination setting value generated by the front stage PWM signal outputting unit and the dead time value matches to the counter value. Further, when the difference is greater than the dead time value, the later stage PWM signal outputting unit is configured to generate the start signal when the start setting value generated by itself matches to the counter value.

According to the first aspect of the present invention, when the start setting value generated by itself is smaller than the dead time value, the front stage PWM signal outputting unit is configured to generate the start signal when the dead time value matches to the counter value. Further, when the start setting value generated by itself is greater than the dead time value, the front stage PWM signal outputting unit is configured to generate the start signal when the start setting value generated by itself matches to the counter value.

According to a second aspect of the present invention, in the PWM signal outputting circuit according to the first aspect, the PWM signal outputting units include a first PWM signal outputting unit and a second PWM signal outputting unit.

According to the second aspect of the present invention, the first PWM signal outputting unit is configured to set a first start setting value and a first termination setting value, and is configured to generate a first termination signal and a first start signal. Further, the first PWM signal outputting unit is configured to output a PWM signal, which is raised according to the first start signal and is decreased according to the first termination signal.

According to the second aspect of the present invention, the second PWM signal outputting unit is configured to set a second start setting value and a second termination setting value, and is configured to generate a second termination signal and a second start signal. Further, the second PWM signal outputting unit is configured to output a PWM signal, which is raised according to the second start signal and is decreased according to the second termination signal.

According to the second aspect of the present invention, the first PWM signal outputting unit is configured to generate the first termination signal when the counter value matches to the first termination setting value. Further, the second PWM signal outputting unit is configured to generate the second termination signal when the counter value matches to the second termination setting value.

According to the second aspect of the present invention, one of the PWM signal outputting units is referred to as the second PWM signal outputting unit when the second PWM signal outputting unit generates the PWM signal that is raised first. Further, another one of the PWM signal outputting units is referred to as the first PWM signal outputting unit when the first PWM signal outputting unit generates the PWM signal that is raised next after the PWM signal that is raised first.

According to the second aspect of the present invention, when a difference between the first start setting value and the second termination setting value is smaller than the dead time value, the first PWM signal outputting unit is configured to generate the first start signal when a sum of the second termination setting value and the dead time value matches to the counter value. Further, when the difference is greater than the dead time value, the first PWM signal outputting unit is configured to generate the first start signal when the first start setting value matches to the counter value.

According to the second aspect of the present invention, when the second start setting value is smaller than the dead time value, the second PWM signal outputting unit is configured to generate the second start signal when the dead time value matches to the counter value. Further, when the second start setting value is greater than the dead time value, the second PWM signal outputting unit is configured to generate the second start signal when the second start setting value matches to the counter value.

According to a third aspect of the present invention, in the PWM signal outputting circuit according to the first aspect, the PWM signal outputting units include a first PWM signal outputting unit, a second PWM signal outputting unit, and a third PWM signal outputting unit.

According to the third aspect of the present invention, the first PWM signal outputting unit is configured to set a first start setting value and a first termination setting value, and is configured to generate a first termination signal and a first start signal. Further, the first PWM signal outputting unit is configured to output a PWM signal, which is raised according to the first start signal and is decreased according to the first termination signal.

According to the third aspect of the present invention, the second PWM signal outputting unit is configured to set a second start setting value and a second termination setting value, and is configured to generate a second termination signal and a second start signal. Further, the second PWM signal outputting unit is configured to output a PWM signal, which is raised according to the second start signal and is decreased according to the second termination signal.

According to the third aspect of the present invention, the third PWM signal outputting unit is configured to set a third start setting value and a third termination setting value, and is configured to generate a third termination signal and a third start signal. Further, the third PWM signal outputting unit is configured to output a PWM signal, which is raised according to the third start signal and is decreased according to the third termination signal.

According to the third aspect of the present invention, the first PWM signal outputting unit is configured to generate the first termination signal when the counter value matches to the first termination setting value. Further, the second PWM signal outputting unit is configured to generate the second termination signal when the counter value matches to the second termination setting value. Further, the third PWM signal outputting unit is configured to generate the third termination signal when the counter value matches to the third termination setting value.

According to the third aspect of the present invention, one of the PWM signal outputting units is referred to as the third PWM signal outputting unit when the third PWM signal outputting unit generates the PWM signal that is raised first. Further, another one of the PWM signal outputting units is referred to as the second PWM signal outputting unit when the second PWM signal outputting unit generates the PWM signal that is raised next after the PWM signal that is raised first. Further, still another one of the PWM signal outputting units is referred to as the first PWM signal outputting unit when the first PWM signal outputting unit generates the PWM signal that is raised next after the PWM signal that is raised second.

According to the third aspect of the present invention, when a difference between the first start setting value and the second termination setting value is smaller than the dead time value, the first PWM signal outputting unit is configured to generate the first start signal when a sum of the second termination setting value and the dead time value matches to the counter value. Further, when the difference is greater than the dead time value, the first PWM signal outputting unit is configured to generate the first start signal when the first start setting value matches to the counter value.

According to the third aspect of the present invention, when a difference between the second start setting value and the third termination setting value is smaller than the dead time value, the second PWM signal outputting unit is configured to generate the second start signal when a sum of the third termination setting value and the dead time value matches to the counter value. Further, when the difference is greater than the dead time value, the second PWM signal outputting unit is configured to generate the second start signal when the second start setting value matches to the counter value.

According to the third aspect of the present invention, when the third start setting value is smaller than the dead time value, the third PWM signal outputting unit is configured to generate the third start signal when the dead time value matches to the counter value. Further, when the third start setting value is greater than the dead time value, the third PWM signal outputting unit is configured to generate the third start signal when the second start setting value matches to the counter value.

According to a fourth aspect of the present invention, in the PWM signal outputting circuit according to the first aspect, the PWM signal outputting units include a first PWM signal outputting unit and a second PWM signal outputting unit.

According to the fourth aspect of the present invention, the first PWM signal outputting unit is configured to set a first start setting value and a first termination setting value, and is configured to generate a first termination signal and a first start signal. Further, the first PWM signal outputting unit is configured to output a PWM signal, which is raised according to the first start signal and is decreased according to the first termination signal.

According to the fourth aspect of the present invention, the second PWM signal outputting unit is configured to set a second start setting value and a second termination setting value, and is configured to generate a second termination signal and a second start signal. Further, the second PWM signal outputting unit is configured to output a PWM signal, which is raised according to the second start signal and is decreased according to the second termination signal.

According to the fourth aspect of the present invention, the first PWM signal outputting unit is configured to generate the first termination signal when the counter value matches to the first termination setting value. Further, the second PWM signal outputting unit is configured to generate the second termination signal when the counter value matches to the second termination setting value.

According to the fourth aspect of the present invention, one of the PWM signal outputting units is referred to as the second PWM signal outputting unit when the second PWM signal outputting unit generates the PWM signal that is raised first. Further, another one of the PWM signal outputting units is referred to as the first PWM signal outputting unit when the first PWM signal outputting unit generates the PWM signal that is raised next after the PWM signal that is raised first.

According to the fourth aspect of the present invention, the first PWM signal outputting unit is configured to generate the first start signal when a sum of the first termination setting value and the dead time value matches to the counter value.

According to the fourth aspect of the present invention, the second PWM signal outputting unit is configured to generate the second start signal when the second start setting value matches to the counter value.

As described above, according to the present invention, it is possible to set a plurality of PWM signals with a higher degree of flexibility. Further, it is possible to perform a proper operation even when each of the PWM signals is used in a mutually compensating manner (an inverted phase).

DETAILED DESCRIPTION OF PREFERRED EMBODIMENTS

Hereunder, preferred embodiments of the present invention will be explained with reference to the accompanying drawings.

First Embodiment

Figure 3:
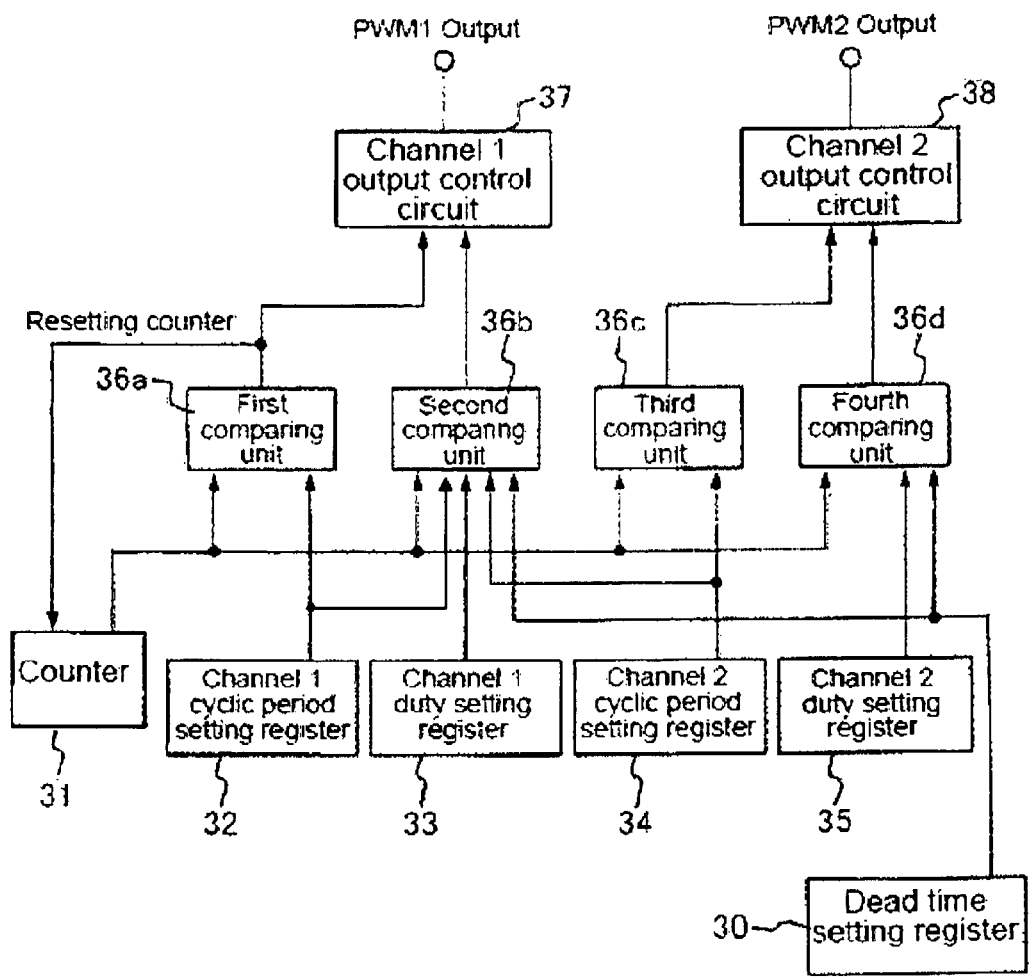
FIG. 3 is a block diagram showing an example of a configuration of a PWM signal outputting circuit according to a first embodiment of the present invention.

A first embodiment of the present invention will be explained. FIG. 3 is a block diagram showing an example of a configuration of a PWM (Pulse Width Modulation) signal outputting circuit according to the first embodiment of the present invention.

Figure 1:
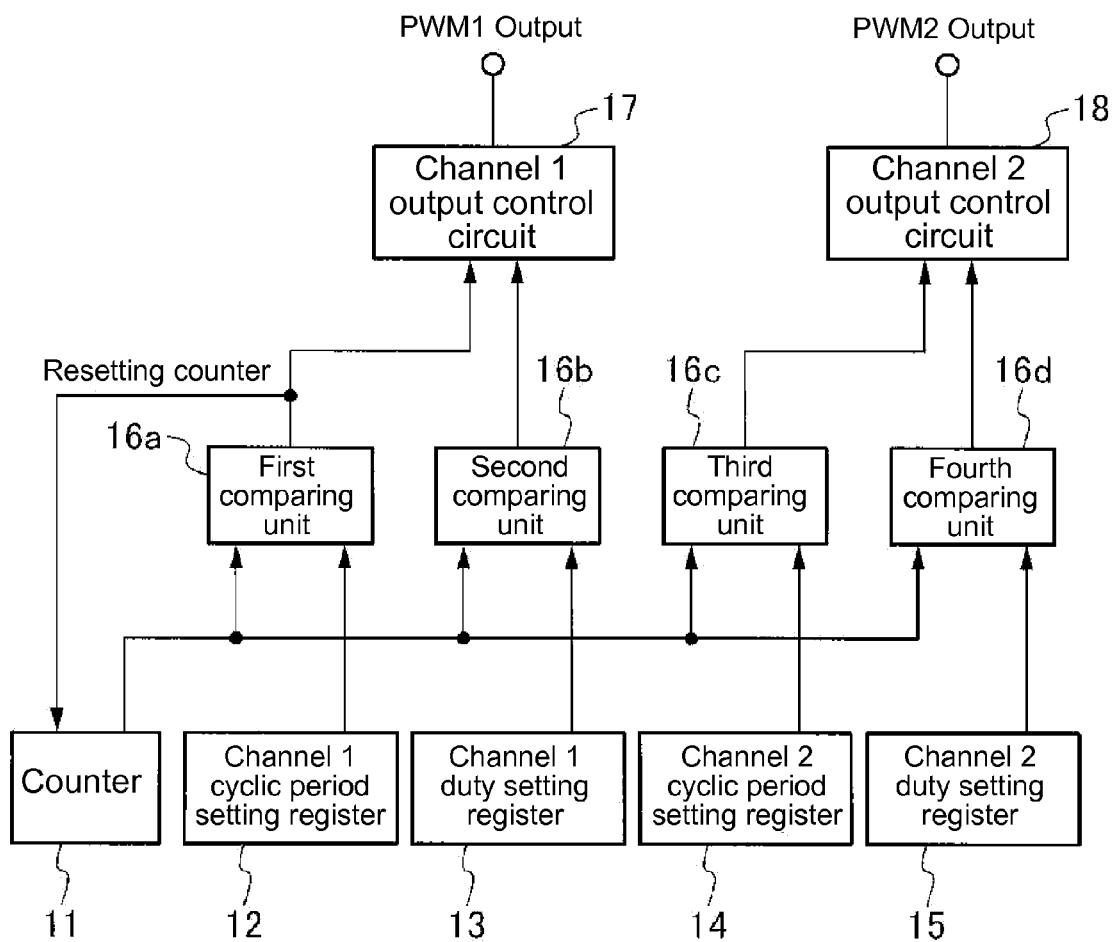
FIG. 1 is a block diagram showing an example of a configuration of a conventional PWM (Pulse Width Modulation) signal outputting circuit capable of arbitrarily controlling a cyclic period and a duty.
Figure 2:
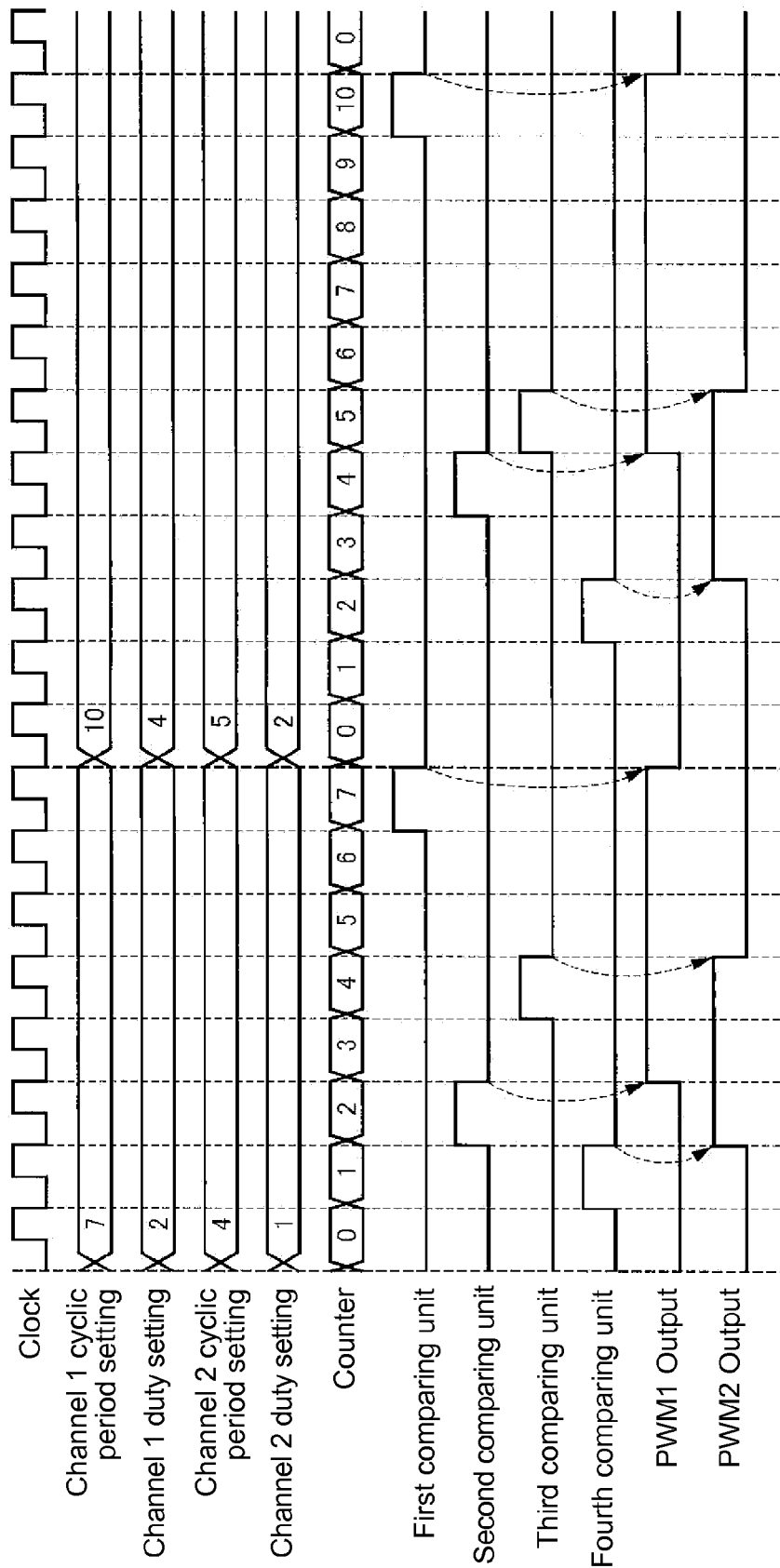
FIG. 2 is a timing chart showing an example of an operation of the conventional PWM signal outputting circuit.

In the embodiment, different from the conventional PWM signal outputting circuit shown in FIG. 1, which is capable of arbitrarily controlling the cyclic period and the duty, the PWM signal outputting circuit is provided with a dead time setting register 30. Further, different from the second comparing unit 16b and the fourth comparing unit 16d of the conventional PWM signal outputting circuit, the PWM signal outputting circuit includes a comparing unit capable of performing an appropriate operation in a mutually compensating manner relative to a plurality of PWM signals while being capable of setting with a high degree of flexibility.

In the embodiment, the PWM signal outputting circuit may be formed of, for example, a semiconductor device such as a micro-computer and the like. More specifically, as shown in FIG. 3, the PWM signal outputting circuit includes a counter 31; a channel 1 cyclic period setting register 32; a channel 1 duty setting register 33; a channel 2 cyclic period setting register 34; a channel 2 duty setting register 35; a first comparing unit 36a; a second comparing unit 36b; a third comparing unit 36c; a fourth comparing unit 36d; a channel 1 output control circuit 37; a channel 2 output control circuit 38; and the dead time setting register 30.

In the embodiment, the counter 31 is configured to operate synchronizing with a clock output from, for example, a timer and the like disposed in the micro-computer, so that the counter 31 counts the number of the clocks and outputs the number as a counter value.

In the embodiment, the channel 1 cyclic period setting register 32, the channel 1 duty setting register 33, the first comparing unit 36a, the second comparing unit 36b and the channel 1 output control circuit 37 constitute a first PWM signal generating unit for outputting a first PWM signal (PWM1). Similarly, the channel 2 cyclic period setting register 34, the channel 2 duty setting register 35, the third comparing unit 36c, the fourth comparing unit 36d and the channel 2 output control circuit 38 constitute a second PWM signal generating unit for outputting a second PWM signal (PWM2).

Accordingly, the PWM signal outputting circuit having the configuration shown in FIG. 3 is configured to generate and output the PWM signals in two phases (two channels), i.e., the first PWM signal (PWM1) and the second PWM signal (PWM2).

In the embodiment, the channel 1 cyclic period setting register 32 is configured to store a first termination setting value for decreasing the first PWM signal (PWM1) to be generated with the first PWM signal generating unit. Further, the channel 1 duty setting register 33 is configured to store a first start setting value for raising the first PWM signal (PWM1) to be generated with the first PWM signal generating unit.

In the embodiment, the channel 2 cyclic period setting register 34 is configured to store a second termination setting value for decreasing the second PWM signal (PWM1) to be generated with the second PWM signal generating unit. Further, the channel 2 duty setting register 35 is configured to store a second start setting value for raising the second PWM signal (PWM1) to be generated with the second PWM signal generating unit.

In the embodiment, the dead time setting register 30 is configured to store a dead time value set as a period of time during which the first PWM signal (PWM1) and the second PWM signal (PWM2) are simultaneously turned off.

In the embodiment, the first comparing unit 36a is configured to compare the first termination setting value stored in the channel 1 cyclic period setting register 32 with the counter value output from the counter 31. When the first termination setting value matches to the counter value, the first comparing unit 36a outputs a first termination signal and a reset signal for resetting the first termination setting value and the counting operation of the counter 31.

In the embodiment, the second comparing unit 36b has a function of performing a dead time addition control operation. More specifically, the second comparing unit 36b is configured to determine a value obtained through subtracting the second termination setting value stored in the channel 2 cyclic period setting register 34 from the first termination setting value stored in the channel 1 cyclic period setting register 32. Further, the second comparing unit 36b is configured to compare the value with the dead time value stored in the dead time setting register 30 to determine whether the value is smaller than the dead time value.

In the embodiment, when the second comparing unit 36b determines that the value is smaller than the dead time value, the second comparing unit 36b is configured to compare a sum of the dead time value and the second termination setting value stored in the channel 2 cyclic period setting register 34 with the counter value output from the counter 31. When the sum matches to the counter value, the second comparing unit 36b generates and outputs the first start signal. When the sum is equal to or greater than the counter value, the second comparing unit 36b is configured to compare the first start setting value stored in the channel 1 duty setting register 33 with the counter value output from the counter 31. When the first start setting value matches to the counter value, the second comparing unit 36b generates and outputs the first start signal.

In the embodiment, when the second comparing unit 36b outputs the first start signal, the channel 1 output control circuit 37 is configured to generate and output the first PWM signal (PWM1). Further, when the first comparing unit 36a outputs the first termination signal, the channel 1 output control circuit 37 is configured to stop generating the first PWM signal (PWM1).

In the embodiment, the third comparing unit 36c is configured to compare the second termination setting value stored in the channel 2 cyclic period setting register 34 with the counter value output from the counter 31. When the second termination setting value matches to the counter value, the third comparing unit 36c outputs a second termination signal.

In the embodiment, the fourth comparing unit 36d has a function of performing the dead time addition control operation. More specifically, the fourth comparing unit 36d is configured to determine whether the second start setting value stored in the channel 2 duty setting register 35 is smaller than the dead time value stored in the dead time setting register 30. When the fourth comparing unit 36d determines that the second start setting value is smaller than the dead time value, the fourth comparing unit 36d is configured to compare the dead time value with the counter value output from the counter 31. When the dead time value matches to the counter value, the fourth comparing unit 36d generates and outputs the second start signal. When the dead time value is equal to or greater than the counter value, the fourth comparing unit 36d is configured to compare the second start setting value stored in the channel 2 duty setting register 35 with the counter value output from the counter 31. When the second start setting value matches to the counter value, the fourth comparing unit 36d generates and outputs the second start signal.

In the embodiment, when the fourth comparing unit 36d outputs the second start signal, the channel 2 output control circuit 38 is configured to generate and output the second PWM signal (PWM2). Further, when the third comparing unit 36c outputs the second termination signal, the channel 2 output control circuit 38 is configured to stop generating the second PWM signal (PWM2).

As described above, in the PWM signal outputting circuit having the configuration shown in FIG. 3, the first PWM signal generating unit and the second PWM signal generating unit are configured to generate and output the first PWM signal (PWM1) and the second PWM signal (PWM2) having the duty values corresponding to the values set in the channel 1 cyclic period setting register 32 and the channel 1 duty setting register 33, and the channel 2 cyclic period setting register 34 and the channel 2 duty setting register 35, respectively, according to the counter value output from the counter 31.

In the embodiment, when the first PWM signal generating unit and the second PWM signal generating unit generate and output the first PWM signal (PWM1) and the second PWM signal (PWM2), the period of time during which the first PWM signal (PWM1) and the second PWM signal (PWM2) thus generated and other adjacent PWM signals are simultaneously turned off is compared with the dead time value set in the dead time setting register 30. Accordingly, it is configured such that the rise of the first PWM signal (PWM1) and the second PWM signal (PWM2) is delayed, so that the period of time during which the first PWM signal (PWM1) and the second PWM signal (PWM2) thus generated and other adjacent PWM signals are simultaneously turned off becomes smaller than the dead time value.

Figure 4:
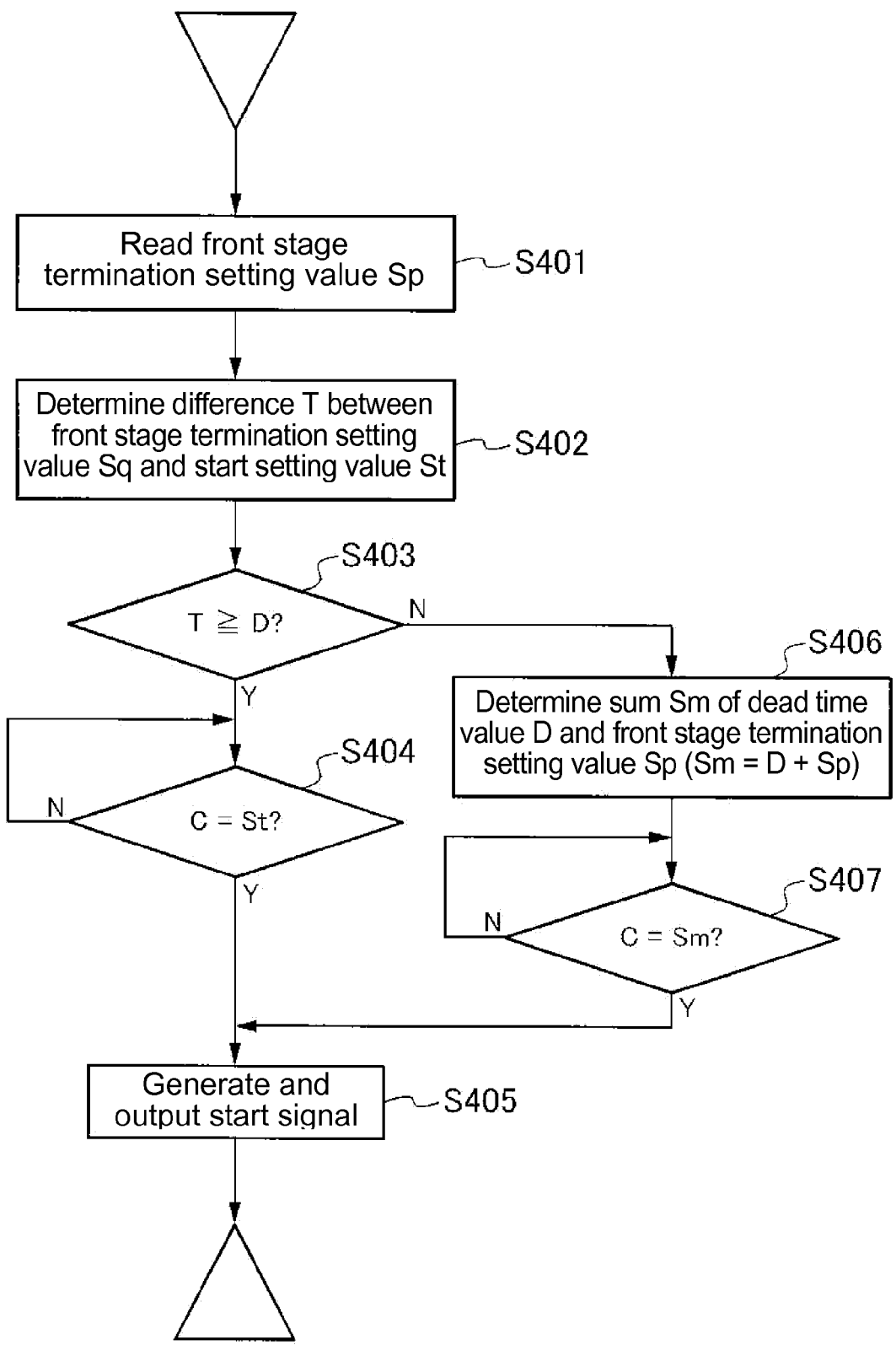
FIG. 4 is a flow chart showing an example of an operation of the PWM signal outputting circuit according to the first embodiment of the present invention.

An operation of the PWM signal outputting circuit having the configuration shown in FIG. 3 will be explained with reference to a flow chart shown in FIG. 4. FIG. 4 is the flow chart showing an example of the operation of the PWM signal outputting circuit according to the first embodiment of the present invention.

In step S401, the fourth comparing unit 36d shown in FIG. 3 reads a front stage termination setting value Sp for raising the PWM signal to be raised first. In step S402, the fourth comparing unit 36d determines a difference T between the front stage termination setting value Sp and a start setting value St of itself through subtracting the front stage termination setting value Sp thus read from the start setting value St of itself (T=St−Sp).

In step S403, the fourth comparing unit 36d compares the difference T with the dead time value D to determine whether the difference T is equal to or greater than the dead time value D (T≥D). When the fourth comparing unit 36d determines that the difference T is equal to or greater than the dead time value D, the process proceeds to step S404.

In step S404, the fourth comparing unit 36d compares the counter value C output from the counter 31 with the start setting value St to determine whether the counter value C is equal to the start setting value St (C=St). When the fourth comparing unit 36d determines that the counter value C is equal to the start setting value St, the process proceeds to step S405. In step S405, the fourth comparing unit 36d generates and outputs the start signal.

When the fourth comparing unit 36d determines that the difference T is not equal to or greater than the dead time value D in step S403, the process proceeds to step S406. In step S406, the fourth comparing unit 36d determines a sum Sm of the dead time value D and the front stage termination setting value Sp (Sm=D+Sp).

In step S407, the fourth comparing unit 36d compares the sum Sm with the counter value C to determine whether the counter value C is equal to the sum Sm (C=Sm). When the fourth comparing unit 36d determines that the counter value C is equal to the sum Sm, the process proceeds to step S405. In step S405, the fourth comparing unit 36d generates and outputs the start signal.

In the embodiment, it should be noted that the second comparing unit 36b shown in FIG. 3 is provided in the PWM signal outputting unit that outputs the PWM signal to be raised first. Further, although not shown in the flow chart, the second comparing unit 36b is configured to compare the start setting value of itself with the dead time value. When the start setting value of itself is smaller than the dead time value, and the dead time matches to the counter value, the second comparing unit 36b generates the start signal. When the start setting value of itself is equal to or greater than the dead time value, and the start setting value of itself matches to the counter value, the second comparing unit 36b generates the start signal.

Figure 5:
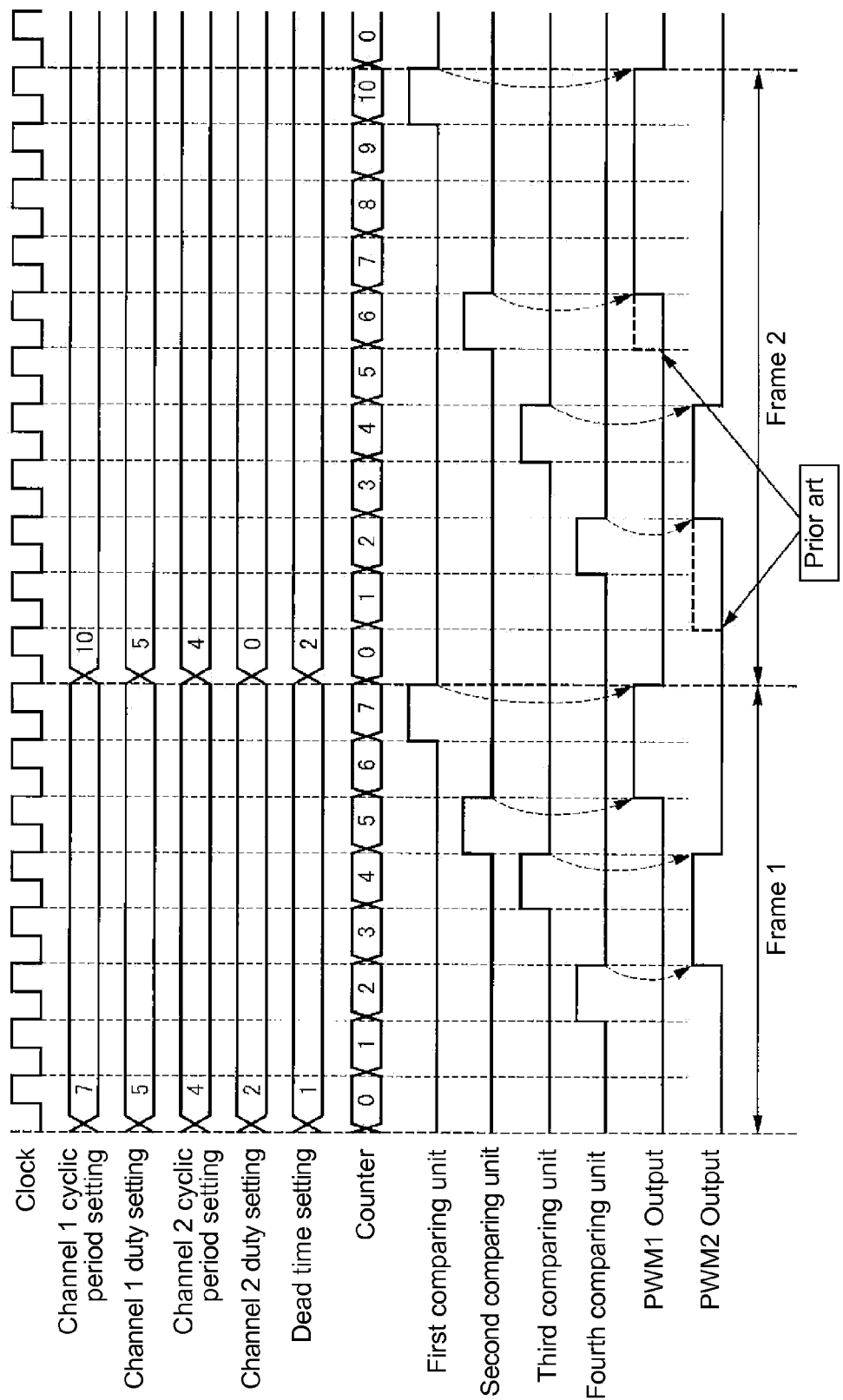
FIG. 5 is a timing chart showing an example of the operation of the PWM signal outputting circuit according to the first embodiment of the present invention.

The operation of the PWM signal outputting circuit will be explained next with reference to FIG. 5. FIG. 5 is a timing chart showing an example of the operation of the PWM signal outputting circuit according to the first embodiment of the present invention.

In the example of the operation of the PWM signal outputting circuit, in the period of the first frame (the frame 1), it is supposed that the termination setting value of "7" is set in the channel 1 cyclic period setting register 32; the start setting value of "5" is set in the channel 1 duty setting register 33; the termination setting value of "4" is set in the channel 2 cyclic period setting register 34; the start setting value of "2" is set in the channel 2 duty setting register 35; and the dead time value of "1" is set in the dead time setting register 30.

Further, in the period of the second frame (the frame 2), it is supposed that the termination setting value of "10" is set in the channel 1 cyclic period setting register 32; the start setting value of "5" is set in the channel 1 duty setting register 33; the termination setting value of "4" is set in the channel 2 cyclic period setting register 34; the start setting value of "0" is set in the channel 2 duty setting register 35; and the dead time value of "2" is set in the dead time setting register 30.

In the embodiment, when the setting values are set as described above, the second PMW signal generating unit generates the PMW signal before the first PMW signal generating unit generates the PMW signal.

In the embodiment, in the first PMW signal generating unit, when the setting values are set as described above, first, the second comparing unit 36b subtracts the start setting value set in the channel 2 cyclic period setting register 34 from the start setting value set in the channel 1 duty setting register 33 to obtain the value (the difference). Then, the second comparing unit 36b compares the value with the dead time value set in the dead time setting register 30 to determine whether the value is smaller than the dead time value.

More specifically, in the example shown in FIG. 5, in the period of the first frame (the frame 1), the start setting value "4" set in the channel 2 cyclic period setting register 34 is subtracted from the start setting value "5" set in the channel 1 duty setting register 33 to obtain the value "1" (5−4=1). Accordingly, the value "1" is equal to the dead time value "1" set in the dead time setting register 30.

As described above, in the embodiment, when the value "1" is equal to (or greater than) the dead time value "1" set in the dead time setting register 30, the second comparing unit 36*b* performs the normal operation. That is, the second comparing unit 36*b* outputs the start signal to the channel 1 output control circuit 37 when the start setting value "5" set in the channel 1 duty setting register 33 matches to the counter value output from the counter 31. Accordingly, the PWM 1 output from the channel 1 output control circuit 37 is changed from "L" to "H".

In the example shown in FIG. 5, in the period of the second frame (the frame 2), the dead time value set in the dead time setting register 30 becomes "2". Further, similar to the first frame, the start setting value "5" is set in the channel 1 duty setting register 33 and the start setting value "4" is set in the channel 2 cyclic period setting register 34, thereby obtaining the value (the difference) "1". Accordingly, the value "1" is smaller than the dead time value "2" set in the dead time setting register 30.

In this case, the second comparing unit 36*b* adds the termination setting value "4" set in the channel 2 cyclic period setting register 34 to the dead time value "2" set in the dead time setting register 30 to obtain the sum "6". Then, the second comparing unit 36*b* compares the sum "6" with the counter value output from the counter 31. When the sum "6" matches to the counter value output from the counter 31, the second comparing unit 36*b* generates and outputs the start signal.

Further, in the embodiment, in the second PMW signal generating unit, when the setting values are set as described above, first, the fourth comparing unit 36*d* compares the start setting value set in the channel 2 duty setting register 35 with the dead time value set in the dead time setting register 30 to determine whether the start setting value is smaller than the dead time value. When the start setting value is smaller than the dead time value, the fourth comparing unit 36*d* generates and outputs the start signal when the dead time value matches to the counter value output from the counter 31. When the start setting value is equal to or greater than the dead time value, the fourth comparing unit 36*d* generates and outputs the start signal when the start setting value of itself matches to the counter value output from the counter 31.

More specifically, in the example shown in FIG. 5, in the period of the first frame (the frame 1), the start setting value "2" set in the channel 2 cyclic period setting register 34 is greater than the dead time value "1" set in the dead time setting register 30. Accordingly, the fourth comparing unit 36*d* generates and outputs the start signal when the start setting value "2" set in the channel 2 duty setting register 35 matches to the counter value output from the counter 31. Accordingly, the PWM 2 output from the channel 2 output control circuit 38 is changed from "L" to "H".

In the example shown in FIG. 5, in the period of the second frame (the frame 2), the start setting value set in the channel 1 duty setting register 33 becomes "0", and the dead time value set in the dead time setting register 30 becomes "2". Accordingly, the start setting value "0" set in the channel 1 duty setting register 33 is smaller than the dead time value "2" set in the dead time setting register 30.

In this case, the fourth comparing unit 36*d* generates and outputs the start signal when the dead time value "2" set in the dead time setting register 30 matches to the counter value output from the counter 31. Accordingly, the PWM 2 output from the channel 2 output control circuit 38 is changed from "L" to "H".

As described above, in the PWM signal outputting circuit having the configuration shown in FIG. 3, the two phase signals, i.e., the first PWM signal (PWM1) and the second PWM signal (PWM2), have the respective cyclic periods and the duty setting values. Only when there is no off period simultaneously, in which the respective cyclic periods and the duty setting values are equal to or greater than the dead time setting value, the respective duty values of the first PWM signal (PWM1) and the second PWM signal (PWM2) are reduced. Accordingly, it is possible to forcibly set the simultaneous off period, thereby increasing flexibility in setting the values.

Second Embodiment

A second embodiment of the present invention will be explained next with reference to FIGS. 6 and 7. Components in the second embodiment similar to those in the first embodiment are designated with the same reference numerals, and explanations thereof are omitted.

Figure 6:
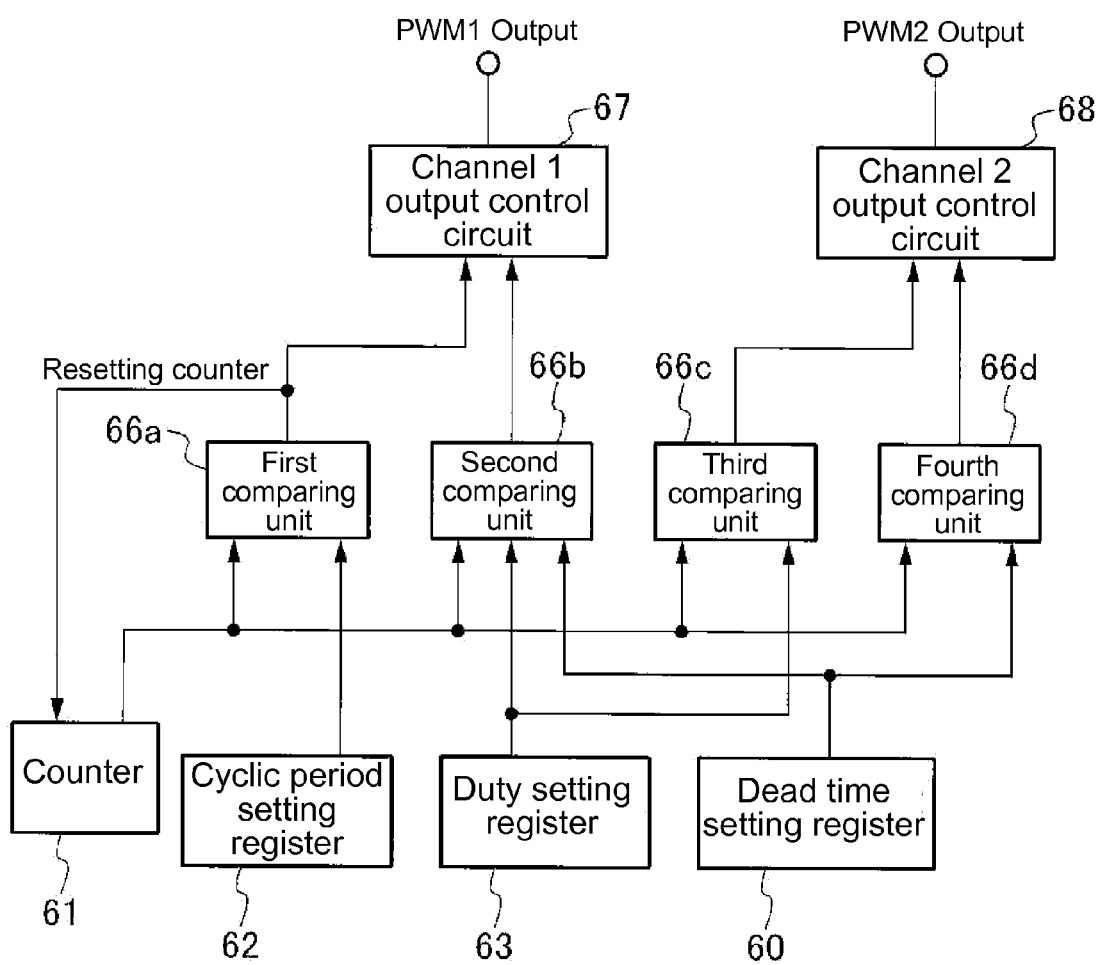
FIG. 6 is a block diagram showing an example of a configuration of a PWM signal outputting circuit according to a second embodiment of the present invention.

FIG. 6 is a block diagram showing an example of a configuration of a PWM signal outputting circuit according to the second embodiment of the present invention.

As shown in FIG. 6, the PWM signal outputting circuit includes a counter 61; a cyclic period setting register 62; a duty setting register 63; a dead time setting register 60; a first comparing unit 66*a*; a second comparing unit 66*b*; a third comparing unit 66*c*; a fourth comparing unit 66*d*; a channel 1 output control circuit 67; and a channel 2 output control circuit 68.

In the PWM signal outputting circuit having the configuration shown in FIG. 6, the duty setting register 63 is configured to share with the channel 1 duty setting register 33 constituting the first PWM signal generating unit as the channel 2 cyclic period setting register 34 constituting the second PWM signal generating unit in the PWM signal outputting circuit shown in FIG. 3. Further, the dead time setting register 60 is configured to share with the dead time setting register 30 as the channel 2 duty setting register 35 constituting the second PWM signal generating unit in the PWM signal outputting circuit shown in FIG. 3.

More specifically, in the embodiment, the cyclic period setting register 62, the duty setting register 63, the first comparing unit 66*a*, the second comparing unit 66*b* and the channel 1 output control circuit 67 constitute the first PWM signal generating unit for outputting the first PWM signal (PWM1). Similarly, the duty setting register 63, the dead time setting register 60, the third comparing unit 66*c*, the fourth comparing unit 66*d* and the channel 2 output control circuit 68 constitute the second PWM signal generating unit for outputting the second PWM signal (PWM2).

In the embodiment, the cyclic period setting register 62 is configured to store the first termination setting value for decreasing the first PWM signal (PWM1) to be generated with the first PWM signal generating unit. Further, the duty setting register 63 is configured to store the start setting value for raising the first PWM signal (PWM1) to be generated with the first PWM signal generating unit. It should be noted that the start setting value is also used for raising the second PWM signal (PWM2) to be generated with the second PWM signal generating unit as well (the second start setting value).

In the embodiment, the dead time setting register 60 is configured to store the dead time value set as the period of time during which the first PWM signal (PWM1) and the second PWM signal (PWM2) are simultaneously turned off. It should be noted that the dead time value is also used for raising the second PWM signal (PWM2) to be generated with the second PWM signal generating unit as well (the second start setting value).

In the embodiment, the second comparing unit 66b constituting the first PWM signal generating unit is configured to add the dead time value set in the dead time setting register 60 to the start setting value stored in the duty setting register 63 to obtain a sum. Further, the second comparing unit 66b is configured to compare the sum with the counter value output from the counter 61. When the sum matches to the counter value, the second comparing unit 66b generates and outputs the start signal (the first start signal). When the second comparing unit 66b generates and outputs the start signal, the channel 1 output control circuit 67 generates and outputs the PWM signal (PWM1).

In the embodiment, the first comparing unit 66a constituting the first PWM signal generating unit is configured to compare the termination setting value set in the cyclic period setting register 62 with the counter value output from the counter 61. When the termination setting value matches to the counter value, the first comparing unit 66a generates and outputs the termination signal (the first termination signal) and the reset signal. When the first comparing unit 66a outputs the termination signal, the channel 1 output control circuit 67 stops generating and outputting the PWM signal (PWM1). Further, when the first comparing unit 66a outputs the reset signal, the counting operation of the counter 61 is reset.

In the embodiment, the fourth comparing unit 66d constituting the second PWM signal generating unit is configured to compare the dead time value set in the cyclic period setting register 62 with the counter value output from the counter 61. When the dead time value matches to the counter value, the fourth comparing unit 66d generates and outputs the start signal (the second start signal). When the fourth comparing unit 66d generates and outputs the start signal, the channel 2 output control circuit 68 generates and outputs the PWM signal (PWM2).

In the embodiment, the third comparing unit 66c constituting the second PWM signal generating unit is configured to compare the start setting value set in the duty setting register 63 with the counter value output from the counter 61. When the start setting value matches to the counter value, the third comparing unit 66c generates and outputs the termination signal (the second termination signal). When the third comparing unit 66c outputs the termination signal, the channel 2 output control circuit 68 stops generating and outputting the PWM signal (PWM2).

As described above, the PWM signal outputting circuit having the configuration shown in FIG. 6 includes the counter 61, the cyclic period setting register 62, the duty setting register 63, the dead time setting register 60, the first comparing unit 66a, the second comparing unit 66b, the third comparing unit 66c, the fourth comparing unit 66d, the channel 1 output control circuit 67, and the channel 2 output control circuit 68. Further, the first comparing unit 66a is configured to compare the counted value (the counter value) of the counter 61 with the value of the cyclic period setting register 62.

Further, in the embodiment, the second comparing unit 66b is configured to compare the counted value (the counter value) of the counter 61 with the setting value of the duty setting register 63 and the setting value of the dead time setting register 60.

Further, in the embodiment, the third comparing unit 66c is configured to compare the counted value (the counter value) of the counter 61 with the setting value of the duty setting register 63.

Further, in the embodiment, the fourth comparing unit 66d is configured to compare the counted value (the counter value) of the counter 61 with the setting value of the dead time setting register 60.

An operation of the PWM signal outputting circuit will be explained next. FIG. 7 is a timing chart showing an example of the operation of the PWM signal outputting circuit according to the second embodiment of the present invention.

Figure 7:
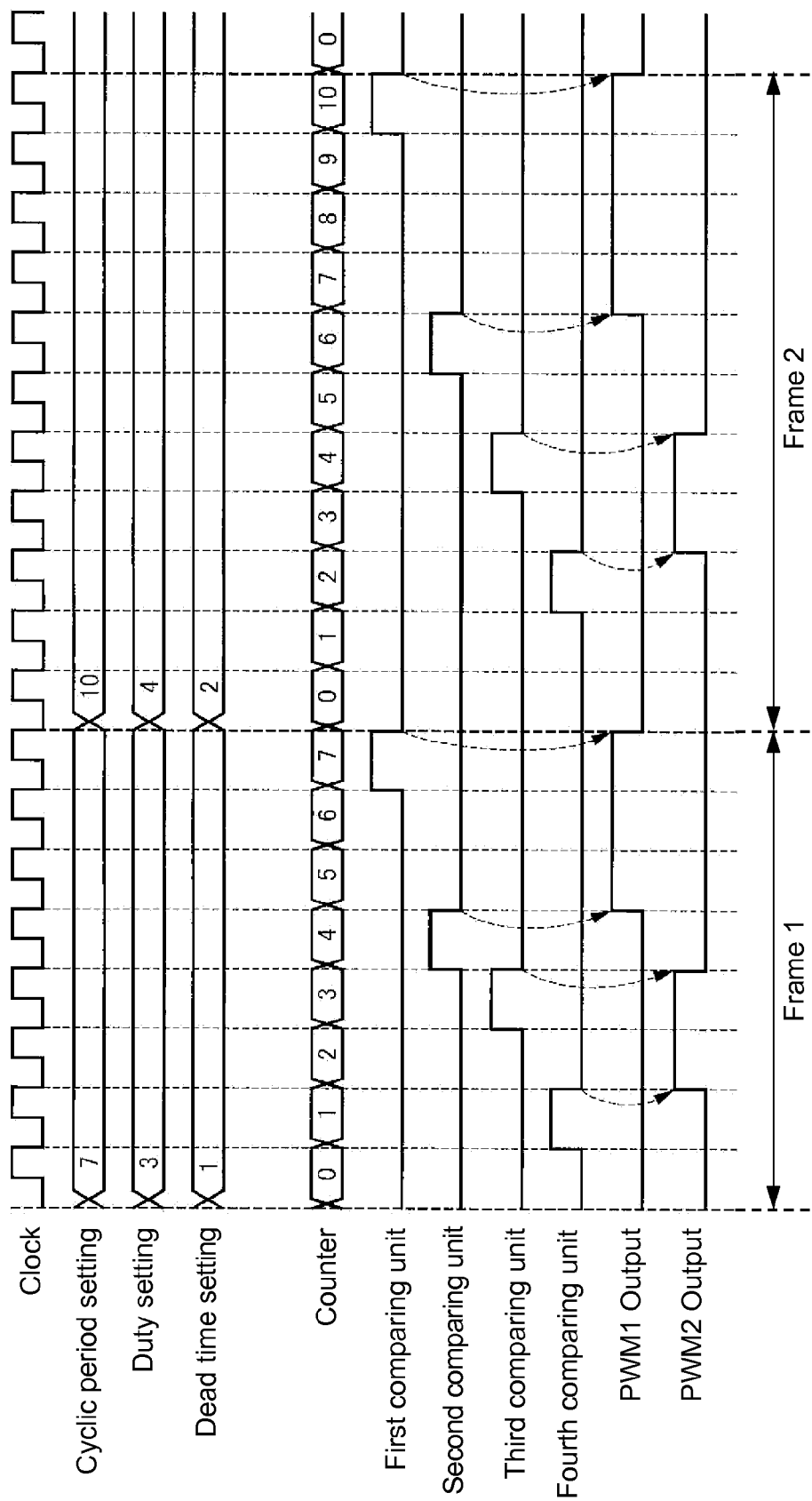
FIG. 7 is a timing chart showing an example of the operation of the PWM signal outputting circuit according to the second embodiment of the present invention.

As shown in FIG. 7, in the period of the frame 1, the setting value of the cyclic period setting register 62 is set "7"; the setting value of the duty setting register 63 is set "3"; and the setting value of the dead time setting register 60 is set "1". In the frame 1, when the counter value output from the counter 61, which operates synchronizing with the clock, matches to the sum of the setting value "3" of the duty setting register 63 and the setting value "1" of the dead time setting register 60, the second comparing unit 66b outputs the "H" signal as the start signal. At the rising of the start signal, the PWM signal (PWM1) output from the channel 1 output control circuit 67 is changed from "L" to "H".

Afterward, when the counter value output from the counter 61 matches to the setting value "7" of the cyclic period setting register 62, the second comparing unit 66b outputs the "H" signal as the termination signal. At the decline of the termination signal, the PWM signal (PWM1) output from the channel 1 output control circuit 67 is changed from "H" to "L", thereby clearing the counter 61.

Further, in the embodiment, when the counter value output from the counter 61 matches to the setting value "1" of the dead time setting register 60, the fourth comparing unit 66d outputs the "H" signal as the start signal. At the decline of the start signal, the PWM signal (PWM2) output from the channel 2 output control circuit 68 is changed from "L" to "H".

Afterward, when the counter value output from the counter 61 matches to the setting value "3" of the duty setting register 63, the third comparing unit 66c outputs the "H" signal as the termination signal. At the decline of the termination signal, the PWM signal (PWM2) output from the channel 2 output control circuit 68 is changed from "H" to "L". Further, the PWM signal (PWM2) output from the channel 2 output control circuit 68 is maintained at "L" until the counter value output from the counter 61 matches to the setting value "7" of the cyclic period setting register 62.

As shown in FIG. 7, in the period of the frame 2, the setting value of the cyclic period setting register 62 is set "10"; the setting value of the duty setting register 63 is set "4"; and the setting value of the dead time setting register 60 is set "2". In the frame 2, when the counter value output from the counter 61 matches to the sum of the setting value "4" of the duty setting register 63 and the setting value "2" of the dead time setting register 60, the PWM signal (PWM1) output from the channel 1 output control circuit 67 is changed from "L" to "H".

Afterward, when the counter value output from the counter 61 matches to the setting value "10" of the cyclic period setting register 62, the PWM signal (PWM1) output from the channel 1 output control circuit 67 is changed from "H" to "L", thereby clearing the counter 61.

Further, in the embodiment, when the counter value output from the counter 61 matches to the setting value "2" of the dead time setting register 60, the PWM signal (PWM2) output from the channel 2 output control circuit 68 is changed from "L" to "H". Afterward, when the counter value output from the counter 61 matches to the setting value "4" of the duty setting register 63, the PWM signal (PWM2) output from the channel 2 output control circuit 68 is changed from "H" to "L". Further, the PWM signal (PWM2) output from the channel 2 output control circuit 68 is maintained at "L" until the counter value output from the counter 61 matches to the setting value "10" of the cyclic period setting register 62

As described above, in the PWM signal outputting circuit having the configuration shown in FIG. 6, the dead time setting register 60 is provided for setting the dead time setting value. Within the period of time of the dead time setting value, the duty is reduced at the rise of the PWM signals (PWM1 and PWM2), thereby making it possible to change both the PWM signals (PWM1 and PWM2) to "L". As a result, it is possible to prevent the timing when the two channels are simultaneously turned on when a wrong value is set to the PWM period and the duty register.

Third Embodiment

A third embodiment of the present invention will be explained next. It should be noted that components in the third embodiment similar to those in the first embodiment and the second embodiment are designated with the same reference numerals, and explanations thereof are omitted.

In the first and second embodiments described with reference to FIGS. 3 to 7, the PWM signal outputting circuit for generating and outputting the two phase PWM signals (channel 1 and channel 2) is explained. The present invention is not limited to the PWM signal outputting circuit for generating and outputting the two phase PWM signals, and may be applicable to a PWM signal outputting circuit for generating and outputting more than three phase PWM signals.

Figure 8:
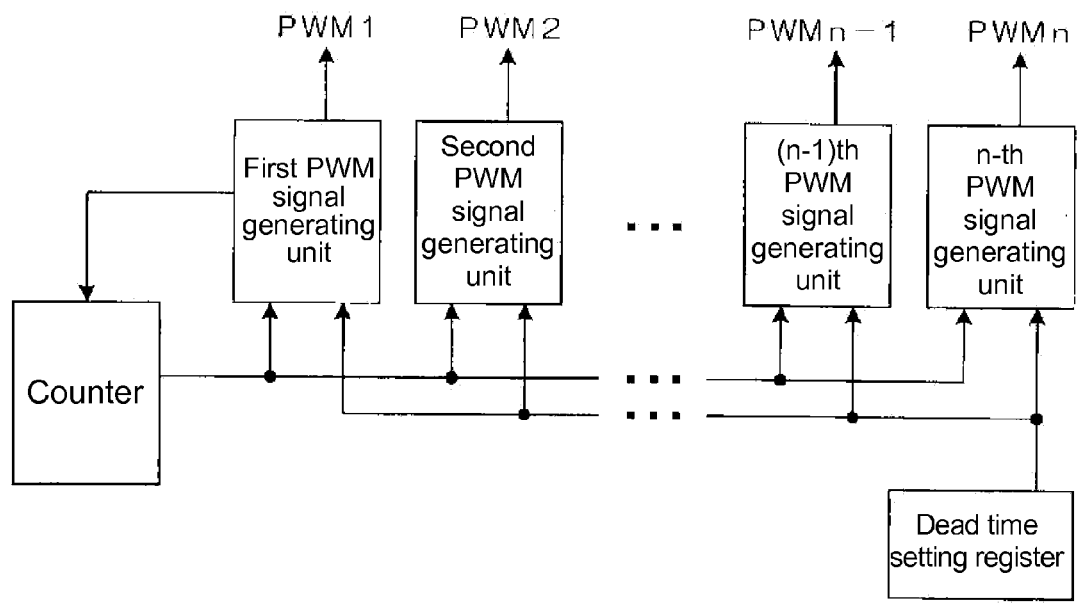
FIG. 8 is a block diagram showing an example of a configuration of a PWM signal outputting circuit according to a third embodiment of the present invention.

FIG. 8 is a block diagram showing an example of a configuration of a PWM signal outputting circuit according to the third embodiment of the present invention. In the third embodiment, the PWM signal outputting circuit is configured to generate and output more than three phase PWM signals.

As shown in FIG. 8, the PWM signal outputting circuit includes the first PWM signal generating unit to the n-th PWM signal generating unit. The first PWM signal generating unit has a configuration similar to that of the first PWM signal generating unit shown in FIG. 3 for performing an operation similar to that of the first PWM signal generating unit shown in FIG. 3.

Further, in the embodiment, each of the second PWM signal generating unit to the (n−1)th PWM signal generating unit has a configuration similar to that of the first PWM signal generating unit shown in FIG. 3 for performing an operation similar to that of the first PWM signal generating unit shown in FIG. 3 except the function of generating and outputting the reset signal. The n-th PWM signal generating unit has a configuration similar to that of the second PWM signal generating unit shown in FIG. 3 for performing an operation similar to that of the second PWM signal generating unit shown in FIG. 3.

In the first to third embodiments described with reference to FIGS. 3 to 8, the PWM signal outputting circuit is configured such that when the period between the two PWM signals raised consecutively is smaller than the dead time setting value, the PWM signal at the later stage is delayed, thereby providing the state that the PWM signals are turned off for the period of time longer than the dead time setting value. Accordingly, it is possible to set with respect to the plurality of the PWM signals with a higher degree of flexibility. Further, it is possible to perform a proper operation even when each of the PWM signals is used in a mutually compensating manner.

It should be noted that the present invention is not limited to the first to third embodiments described with reference to FIGS. 3 to 8, and may be modified within the scope of the present invention. According to the present invention, the PWM signal outputting circuit may be formed of the semiconductor device such as a microcomputer and the like. It may be configured such that the functions of the components may be realized partially or entirely through a programmed computer processing. Alternatively, the functions of the components may be realized through a hardware configuration formed of a logic element circuit and the like.

The disclosure of Japanese Patent Application No. 2011-203398, filed on Sep. 16, 2011, is incorporated in the application by reference.

While the present invention has been explained with reference to the specific embodiments of the present invention, the explanation is illustrative and the present invention is limited only by the appended claims.

What is claimed is:

1. A PWM (Pulse Width Modulation) signal outputting circuit, comprising:

a counting unit for counting a number of clocks to output a counter value, and for resetting the counter value to resume counting when a reset signal is input to the counting unit;

a dead time value storage unit for storing a dead time value; and a plurality of PWM signal outputting units for setting a start setting value and a termination setting value, each of the PWM signal outputting units being configured to generate a termination signal and a start signal, each of said PWM signal outputting units being configured to output a PWM signal, which is raised according to the start signal generated by itself and is decreased according to the termination signal generated by itself, each of said PWM signal outputting units being configured to generate the termination signal when the counter value matches to the termination setting value generated by itself, wherein said PWM signal outputting units includes a front stage PWM signal outputting unit for generating the PWM signal that is raised first, and a later stage PWM signal outputting unit for generating the PWM signal that is raised next after the PWM signal that is raised first, said later stage PWM signal outputting unit is configured to generate the start signal when a sum of the termination setting value generated by the front stage PWM signal outputting unit and the dead time value matches to the counter value, and when a difference between the start setting value generated by itself and the termination setting value generated by the front stage PWM signal outputting unit is smaller than the dead time value, said later stage PWM signal outputting unit is configured to generate the start signal when the start setting value generated by itself matches to the counter value, and when the difference is greater than the dead time value, said front stage PWM signal outputting unit is configured to generate the start signal when the dead time value matches to the counter value, and when the start setting value generated by itself is smaller than the dead time value, and said front stage PWM signal outputting unit is configured to generate the start signal when the start setting value generated by itself matches to the counter value, and when the start setting value generated by itself is greater than the dead time value.

2. The PWM signal outputting circuit according to claim 1, wherein each of said PWM signal outputting units includes,
- a start setting value storage unit for storing the start setting value;
- a termination setting value storage unit for storing the termination setting value;
- a termination comparing unit for generating and outputting the termination signal;
- a start comparing unit for generating and outputting the start signal; and
- an output control unit for generating and outputting the PWM signal.

3. A PWM (Pulse Width Modulation) signal outputting circuit, comprising:
- a counting unit for counting a number of clocks to output a counter value, and for resetting the counter value to resume counting when a reset signal is input to the counting unit;
- a dead time value storage unit for storing a dead time value;
- a first PWM signal outputting unit configured to set a first start setting value and a first termination setting value, said first PWM signal outputting unit being configured to generate a first termination signal and a first start signal, said first PWM signal outputting unit being configured to output a first PWM signal to be raised according to the first start signal and decreased according to the first termination signal; and
- a second PWM signal outputting unit configured to set a second start setting value and a second termination setting value, said second PWM signal outputting unit being configured to generate a second termination signal and a second start signal, said second PWM signal outputting unit being configured to output a second PWM signal to be raised according to the second start signal and decreased according to the second termination signal, said second PWM signal outputting unit being configured to output the second PWM signal before the first PWM signal outputting unit outputs the first PWM signal,
wherein said first PWM signal outputting unit is configured to generate the first termination signal when the counter value matches to the first termination setting value,
said second PWM signal outputting unit is configured to generate the second termination signal when the counter value matches to the second termination setting value,
said first PWM signal outputting unit is configured to generate the first start signal when a sum of the second termination setting value and the dead time value matches to the counter value, and when a difference between the first start setting value and the second termination setting value is smaller than the dead time value,
said first PWM signal outputting unit is configured to generate the first start signal when the first start setting value matches to the counter value, and when the difference is greater than the dead time value,
said second PWM signal outputting unit is configured to generate the second start signal when the second start setting value is smaller than the dead time value, and when the dead time value matches to the counter value, and
said second PWM signal outputting unit is configured to generate the second start signal, and when the second start setting value is greater than the dead time value when the second start setting value matches to the counter value.

4. The PWM signal outputting circuit according to claim 3, wherein said first PWM signal outputting unit includes,
- a first start setting value storage unit for storing the first start setting value;
- a first termination setting value storage unit for storing the first termination setting value;
- a first termination comparing unit for generating and outputting the first termination signal;
- a first start comparing unit for generating and outputting the first start signal; and
- a first output control unit for generating and outputting the first PWM signal.

5. The PWM signal outputting circuit according to claim 3, wherein said second PWM signal outputting unit includes,
- a second start setting value storage unit for storing the second start setting value;
- a second termination setting value storage unit for storing the second termination setting value;
- a second termination comparing unit for generating and outputting the second termination signal;
- a second start comparing unit for generating and outputting the second start signal; and
- a second output control unit for generating and outputting the second PWM signal.

6. A method of controlling an output of a PMW (Pulse Width Modulation) signal output from a PWM signal outputting circuit, said PWM signal outputting circuit including:
- a counting unit for counting a number of clocks to output a counter value, and for resetting the counter value to resume counting when a reset signal is input to the counting unit;
- a dead time value storage unit for storing a dead time value;
- a first PWM signal outputting unit configured to set a first start setting value and a first termination setting value, said first PWM signal outputting unit being configured to generate a first termination signal and a first start signal, said first PWM signal outputting unit being configured to output a first PWM signal to be raised according to the first start signal and decreased according to the first termination signal; and
- a second PWM signal outputting unit configured to set a second start setting value and a second termination setting value, said second PWM signal outputting unit being configured to generate a second termination signal and a second start signal, said second PWM signal outputting unit being configured to output a second PWM signal to be raised according to the second start signal and decreased according to the second termination signal, said second PWM signal outputting unit being configured to output the second PWM signal before the first PWM signal outputting unit outputs the first PWM signal,
wherein the method comprises the steps of:
generating the first termination signal with the first PWM signal outputting unit when the counter value matches to the first termination setting value;
generating the second termination signal with the second PWM signal outputting unit when the counter value matches to the second termination setting value;
generating the first start signal with the first PWM signal outputting unit when a sum of the second termination setting value and the dead time value matches to the counter value, and when a difference between the first start setting value and the second termination setting value is smaller than the dead time value; and generating the first start signal with the first PWM signal outputting unit when the first start setting value matches to the counter value, and when the difference is greater than the dead time value.

\* \* \* \* \*